(12) United States Patent
Wirsing

(10) Patent No.: US 10,042,264 B2
(45) Date of Patent: Aug. 7, 2018

(54) MEASURING DEVICE FOR DETERMINING A POLARISATION PARAMETER

(71) Applicant: Carl Zeiss SMT GmbH, Oberkochen (DE)

(72) Inventor: Andreas Wirsing, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/275,686

(22) Filed: Sep. 26, 2016

(65) Prior Publication Data

US 2017/0010539 A1  Jan. 12, 2017

Related U.S. Application Data

(63) Continuation of application No. PCT/EP2015/000537, filed on Mar. 11, 2015.

(30) Foreign Application Priority Data

Mar. 24, 2014 (DE) .......................... 10 2014 205 406

(51) Int. Cl.
*G03F 7/20* (2006.01)
*G01J 4/00* (2006.01)
*G01M 11/02* (2006.01)

(52) U.S. Cl.
CPC ............ *G03F 7/70191* (2013.01); *G01J 4/00* (2013.01); *G01M 11/0285* (2013.01);
(Continued)

(58) Field of Classification Search
CPC .................................................. G03F 7/70191
(Continued)

(56) References Cited

U.S. PATENT DOCUMENTS 7,286,245 B2  10/2007  Wegmann et al.
2004/0114150 A1*  6/2004  Wegmann ................ G01J 4/04
356/491
(Continued)

FOREIGN PATENT DOCUMENTS

DE         10109929 A1   11/2001
DE     102008001448 A1    1/2009
(Continued)

OTHER PUBLICATIONS

Office Action in corresponding Japanese Application 2016-558733, dated Oct. 3, 2017, along with English Translation.
(Continued)

*Primary Examiner* — Tarifur Chowdhury
*Assistant Examiner* — Omar Nixon
(74) *Attorney, Agent, or Firm* — Edell, Shapiro & Finnan, LLC

(57) ABSTRACT

A measurement system (10) for determining a polarization parameter of an optical system (50) has an illumination system (12) providing an optical radiation (14), a measurement mask (22) arranged between the illumination system and the optical system and including measurement structures (24) arranged at a plurality of field points (26) of the measurement mask, a polarization variation device (28) arranged in a beam path of the optical radiation and configured to vary a polarization state of the optical radiation in a field-point-dependent manner, such that at the same point in time one of the field points is irradiated with the optical radiation (14-1) in a first polarization state and another of the field points is irradiated with the optical radiation (14-2) in a second polarization state, and a detection module (32), which is configured to detect the optical radiation after it has interacted with the optical system.

13 Claims, 3 Drawing Sheets

(52) U.S. Cl.
CPC ........ *G03F 7/7085* (2013.01); *G03F 7/70566* (2013.01); *G03F 7/70591* (2013.01)

(58) Field of Classification Search
USPC .......................................................... 356/491
See application file for complete search history.

(56) References Cited

U.S. PATENT DOCUMENTS

| | | | |
|---|---|---|---|
| 2007/0182969 A1* | 8/2007 | Mengel | G01J 4/04 356/495 |
| 2008/0144043 A1 | 6/2008 | Wegmann et al. | |
| 2010/0045956 A1 | 2/2010 | Van De Kerkhof et al. | |
| 2010/0220303 A1 | 9/2010 | Fiolka | |
| 2011/0032502 A1 | 2/2011 | Nomura | |
| 2012/0092669 A1 | 4/2012 | Fiolka et al. | |
| 2012/0293786 A1* | 11/2012 | Fiolka | G02B 27/286 355/71 |
| 2013/0188160 A1* | 7/2013 | Ruoff | G03F 7/70116 355/52 |

FOREIGN PATENT DOCUMENTS

| | | |
|---|---|---|
| DE | 102007055062 A1 | 5/2009 |
| DE | 102008002247 A1 | 12/2009 |
| DE | 102009015393 B3 | 9/2010 |
| JP | 2011053664 A | 3/2011 |

OTHER PUBLICATIONS

International Search Report and Written Opinion in counterpart International Application No. PCT/EP2015/000537, dated Sep. 14, 2015.

Ruoff et al., "Orientation Zernike Polynomials: A useful way to describe the polarization effects of optical imaging systems", Journal of Microlithography, Microfabrication, and Microsystems, Jul. 2009, vol. 8, No. 3, 031404 (22 pp.).

Malacara, D., "Optical Shop Testing", John Wiley & Sons, Inc., 2nd Edition (1992), chapter 13.2.3 (pp. 464-466).

Gross, H., "Handbook of Optical Systems", vol. 2, 2005 Wiley-VCH Verlag GmbH & Co. KGaA, Weinheim, p. 215.

German Office Action Action regarding DE102014205406.0, dated Nov. 12, 2015 and English translation.

International Preliminary Report on Patentability and Written Opinion in counterpart International Application No. PCT/EP2015/000537, dated Sep. 27, 2016.

Korean Office Action Action regarding KR1020157007564, dated Dec. 21, 2016 and English translation.

Office Action in corresponding Korean Application 1020167029049, dated Jan. 25, 2018, along with English translation.

* cited by examiner

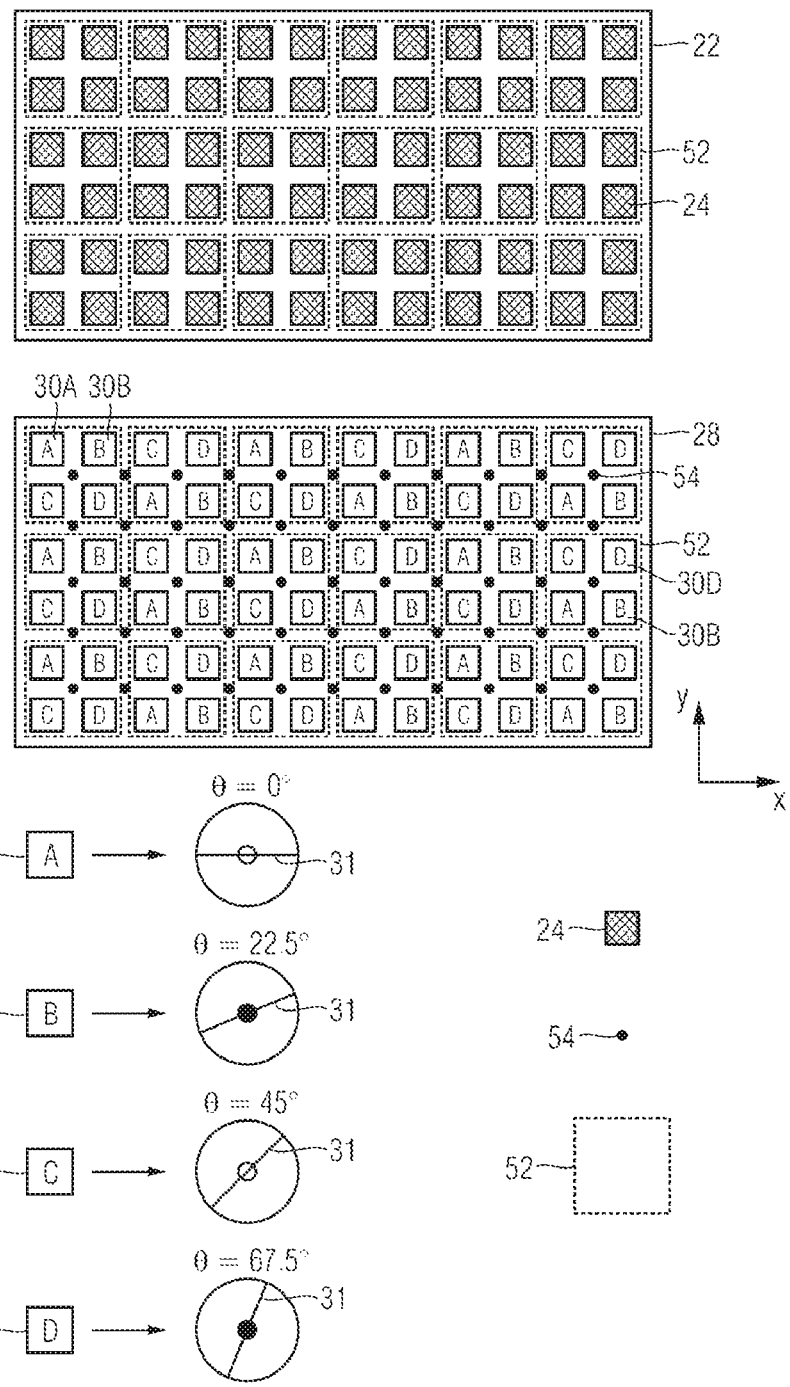

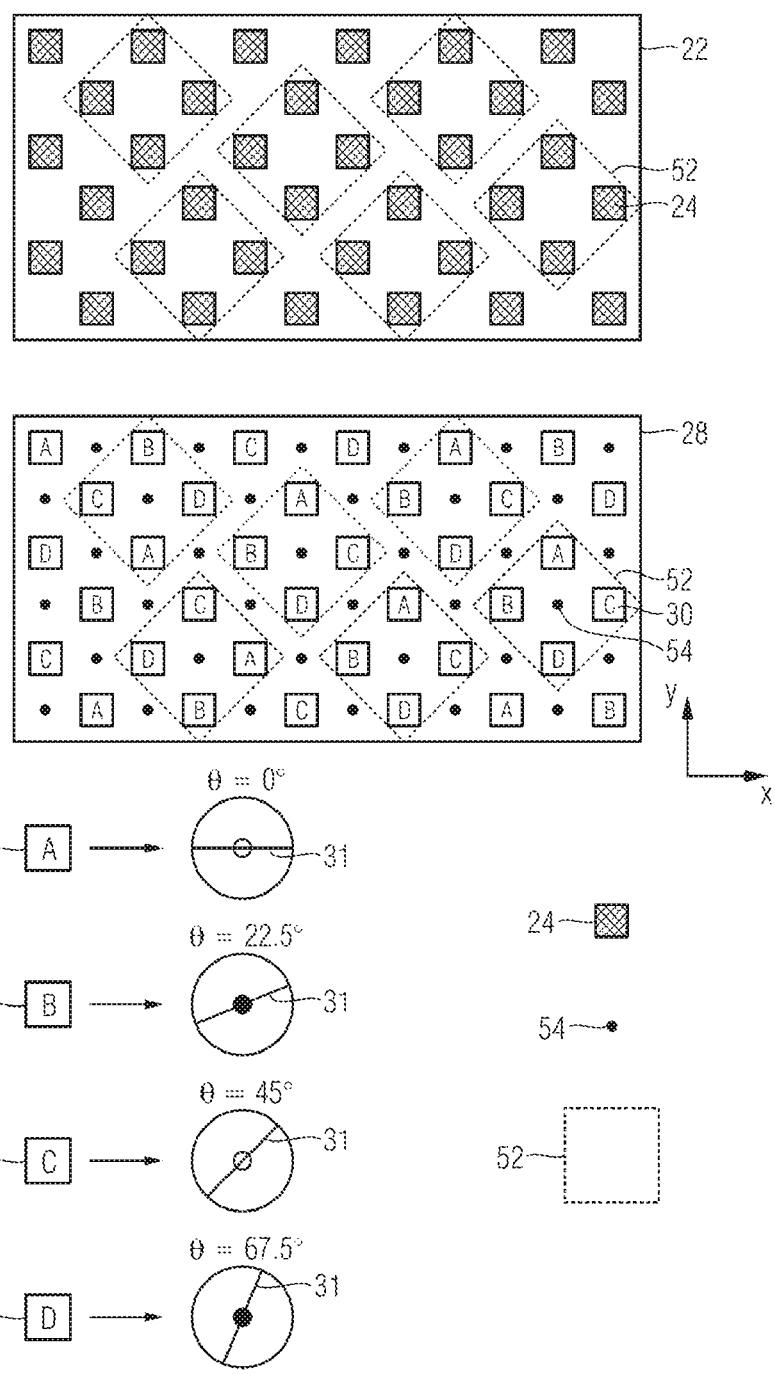

MEASURING DEVICE FOR DETERMINING A POLARISATION PARAMETER

CROSS REFERENCE TO RELATED APPLICATIONS

This is a Continuation of International Application PCT/EP2015/000537, which has an international filing date of Mar. 11, 2015, and the disclosure of which is incorporated in its entirety into the present Continuation by reference. The following disclosure is also based on and claims the benefit of and priority under 35 U.S.C. § 119(a) to German Patent Application No. DE 10 2014 205 406.0, filed Mar. 24, 2014, which is also incorporated in its entirety into the present Continuation by reference.

FIELD OF THE INVENTION

The invention relates to a measurement system and to a method for determining a polarization parameter of an optical system. Furthermore the invention relates to a projection exposure apparatus for microlithography comprising such a measurement system.

BACKGROUND

U.S. Pat. No. 7,286,245 B2 describes a method for determining an influence of an optical system from the polarization state of optical radiation. This method involves determining a Jones matrix of the optical system in two measurement stages. In the first measurement stage, input-side radiation having defined polarization states is radiated successively onto the optical system. The intensities of the resulting output-side polarization states of the radiation emerging from the optical system are thereupon measured using a polarization analyzer. A phase-reduced Jones matrix is calculated therefrom. In a second measurement stage, a global phase term is determined through interferometric measurement. The phase-reduced Jones matrix determined in the first measurement stage is thereupon combined with the global phase term in order to obtain the complete Jones matrix of the optical system.

Polarization parameters, such as the retardation, for instance, can be determined from the Jones matrix. However, if the environmental conditions change during the measuring method described above, then the measurement result can be corrupted thereby.

SUMMARY

It is an object of the invention to provide a measurement system and a method for determining a polarization parameter with which the abovementioned problems are solved, and in particular influences of changing environmental conditions and/or instabilities that occur over the course of time on the measurement result are minimized.

The above object is achieved according to the invention for example by the below-described measurement system for determining a polarization parameter of an optical system. This measurement system comprises an illumination system for providing an optical radiation, a measurement mask, which is arranged between the illumination system and the optical system and comprises measurement structures arranged at a plurality of field points of the measurement mask. Furthermore, the measurement system comprises a polarization variation device, which is arranged in a beam path of the optical radiation and is configured to vary a polarization state of the optical radiation in a field-point-depending manner, such that at the same point in time one of the field points is irradiated with the optical radiation in a first polarization state and another of the field points is irradiated with the optical radiation in a second polarization state. Moreover, the measurement system comprises a detection module, which is configured to detect the optical radiation after interaction with the optical system.

The optical system serving as measurement object of the measurement system according to the invention can be an optical system of a projection exposure apparatus for microlithography, in particular a projection lens of such a projection exposure apparatus. The illumination system is configured in particular to provide the optical radiation in a defined polarization state.

The polarization parameter concerns a parameter which describes a polarization-related interaction of optical radiation with the optical system. In this case, the polarization parameter can define an influencing of a polarization property of the optical radiation that is effected by the optical system. Examples of such polarization parameters are retardation, linear dichroism, rotation and circular dichroism. Furthermore, the polarization parameter can define a polarization dependence of an imaging aberration of the optical system. Such an imaging aberration may be for example a distortion aberration or a focal position aberration of the optical system. A distortion aberration causes a change of relative positions of measurement structures on the measurement mask with respect to one another during imaging with the optical system onto a substrate. Such a distortion aberration is often also referred to as "overlay aberration".

The detection module can furthermore be configured to determine the polarization parameter from the detected optical radiation. Alternatively, the polarization parameter can also be determined separately. By way of example, when determining a distortion aberration using direct overlay metrology the detection module may be a wafer to be exposed. After the exposure of the wafer, the latter can then be examined with regard to the distortion aberrations using a suitable microscope, such as an electron microscope, for instance.

The first polarization state mentioned above differs from the second polarization state. In other words, the polarization variation device is configured to vary the polarization state of the optical radiation such that at least two of the field points are irradiated with the optical radiation in different polarization states at the same point in time. The polarization variation device can be embodied as a continuous element or else comprise a plurality of elements. In accordance with one embodiment, the polarization variation device is arranged between the illumination system and the measurement mask. Alternatively, the polarization variation device can also be arranged in the beam path within the illumination system.

The polarization variation device of the measurement system makes it possible to apply different polarization states to a plurality of measurement channels simultaneously with the optical system and thus to carry out the measurement of the polarization parameter in a temporally narrowly delimited measurement process. Influences of changing environmental conditions and/or instabilities occurring over the course of time on the measurement result can thus be minimized.

In accordance with one embodiment of the measurement system, the polarization variation device comprises at least one polarization rotation element for rotating the incident optical radiation. In particular, the polarization variation device comprises a plurality of polarization rotation elements having different rotation angles, preferably four polarization elements having the rotation angles 0°, 45°, 90° and 135°. The polarization rotation elements can be embodied as half-wave plates. Alternatively, the polarization elements can comprise optically active substances.

The polarization variation device has locations which are assigned to the field points on the measurement mask in the beam path of the optical radiation. Respectively one of the abovementioned polarization rotation elements having different rotation angles is arranged at one of the locations of the polarization variation device which are assigned to the field points. Each of the field points on the measurement mask is thus irradiated with optical radiation which differs in each case with regard to the rotation angle of its polarization direction from radiation which is radiated onto another of the field points on the measurement mask.

In accordance with a further embodiment, the polarization variation device comprises at least one half-wave plate. In particular, the polarization variation device comprises a plurality of half-wave plates having differently oriented optical axes. By way of example, the polarization variation device comprises four half-wave plates having the following orientations of the optical axes relative to the polarization direction of the incident optical radiation: 0°, 22.5°, 45°, 67.5°. This results in rotations of the polarization direction of the incident optical radiation by the following rotation angles: 0°, 45°, 90° and 135°.

In accordance with a further embodiment, the polarization variation device comprises at least one quarter-wave plate. In particular, the polarization variation device comprises a plurality of quarter-wave plates having differently oriented optical axes. In accordance with one embodiment, the optical axes of two quarter-wave plates form an angle of 90°. In particular, said quarter-wave plates are oriented such that their optical axes form an angle of +45° and an angle of −45° with the polarization direction of the optical radiation incident in a linearly polarized state. With such a polarization variation device, circularly polarized radiation states can be radiated onto the optical system and e.g. circular dichroism and/or a rotation of the optical system can thus be determined as polarization parameters. A circularly polarized state is understood to mean a state in which the optical radiation predominantly comprises circularly polarized radiation components.

In accordance with a further embodiment, the measurement structures are arranged in a plurality of measurement fields and the polarization variation device is configured to vary the polarization state of the optical radiation within each of the measurement fields with the same variation pattern in a field-point-dependent manner. In other words, an irradiation with the same spatial polarization distribution is effected in each of the measurement fields comprising the plurality of field points.

In accordance with a further embodiment, the polarization variation device is fixed to the measurement mask. In other words, the measurement mask and the polarization variation device together form a uniform measurement module, for example in the form of a uniform measurement reticle.

In accordance with a further embodiment, the measurement system is configured as a wavefront measurement system. Such a wavefront measurement system can comprise an interferometer, such as, for instance, a shearing interferometer or a point diffraction interferometer.

In accordance with a further embodiment, the detection module comprises a diffraction grating. With such a diffraction grating, the measurement system can be operated as an interferometer.

In accordance with a further embodiment, the measurement structures are configured in each case in a grating-shaped fashion. For distortion aberration measurement, the measurement structures can also be fashioned differently. By way of example, they can be embodied in the shape of crosses for this use.

In accordance with a further embodiment, the illumination system is configured to provide the optical radiation successively in different polarization states. In accordance with one embodiment variant, the different polarization states comprise linearly polarized polarization states of different orientations. A linearly polarized state is understood to mean a state in which the optical radiation predominantly comprises linearly polarized radiation components.

The process of successively radiating in the optical radiation in different polarization states can serve for the calibration of the measurement system. In this case, the measurement channels arranged within a measurement field can be calibrated with regard to their polarization dependence. Measurement fields in this context comprise regions on the measurement mask in which respectively a specific number of measurement structures are arranged. In this case, the polarization variation device is configured to vary the polarization state within each of the measurement fields with the same variation pattern in a field-point-dependent manner.

In other words, by radiating in different polarization states, it is possible to vary the variation pattern of the polarization within a measurement field in which a plurality of measurement structures are arranged. By comparing the measurement results of the polarization parameter for the individual measurement fields in the case of the different variation patterns it is possible to check whether the measurement system is polarization-independent. If this is the case, the same value for the polarization parameter should result for each of the measurement fields in the course of the process of radiating in the different polarization states. If the same values for the polarization parameter result, then it is possible to take as a basis the assumption that the polarization property of the optical system within the measurement field has no measurement-relevant variation. If different values for the polarization parameter are determined and a measurement-relevant variation of the polarization property of the optical system is thus indeed present, this variation can be correspondingly taken into account in the evaluation of the measurement result of future polarization parameter measurements.

In accordance with a further embodiment, the illumination system is configured to provide the optical radiation in a linearly polarized state.

Furthermore, the invention provides a projection exposure apparatus for microlithography comprising a projection lens and a measurement system in one of the embodiments described above, wherein in this case the measurement system is configured for determining a polarization parameter of the projection lens. In this case, the illumination system of the measurement system is preferably identical with the illumination system of the projection exposure apparatus.

Furthermore, the invention provides the below-mentioned method for determining a polarization parameter of an optical system. In this method, a measurement mask comprising measurement structures arranged at a plurality of field points of the measurement mask is provided. Furthermore, an optical radiation is radiated onto the measurement mask with a field-point-dependent polarization pattern in such a way that at the same points in time one of the field points is irradiated with the optical radiation in a first polarization state and another of the field points is irradiated with the optical radiation in a second polarization state. Furthermore, the optical radiation is detected after interaction with the measurement mask and subsequent interaction with the optical system and the optical parameter of the optical system is determined from the detected optical radiation.

In accordance with one embodiment, the method according to the invention is carried out in the measurement system in one of the embodiments described above.

In accordance with a further embodiment of the method according to the invention, when determining the polarization parameter of the optical system, orientation Zernike coefficients of the optical system are determined from the detected optical radiation. The polarization parameter is thereupon determined from the orientation Zernike coefficients. The definition of orientation Zernike coefficients is set out in greater detail in the context of the description of the figures.

The features specified with regard to the abovementioned embodiments, exemplary embodiments and embodiment variants, etc. of the measurement system according to the invention can correspondingly be applied to the method according to the invention. Conversely, the features specified with regard to the abovementioned embodiments, exemplary embodiments and embodiment variants of the method according to the invention can correspondingly be applied to the measurement system according to the invention. These and other features of the embodiments according to the invention are explained in the description of the figures and in the claims. The individual features can be implemented, either separately or in combination, as embodiments of the invention. Furthermore, they can describe advantageous embodiments which are independently protectable and protection for which is claimed if appropriate only during or after pendency of the application.

BRIEF DESCRIPTION OF THE DRAWINGS

The above and further advantageous features of the invention are illustrated in the following detailed description of exemplary embodiments according to the invention with reference to the accompanying schematic drawings. In the figures:

FIG. 2 shows a respective first embodiment of the measurement mask and of the polarization variation device, and FIG. 3 shows a respective second embodiment of the measurement mask and of the polarization variation device.

DETAILED DESCRIPTION

Figure 1:
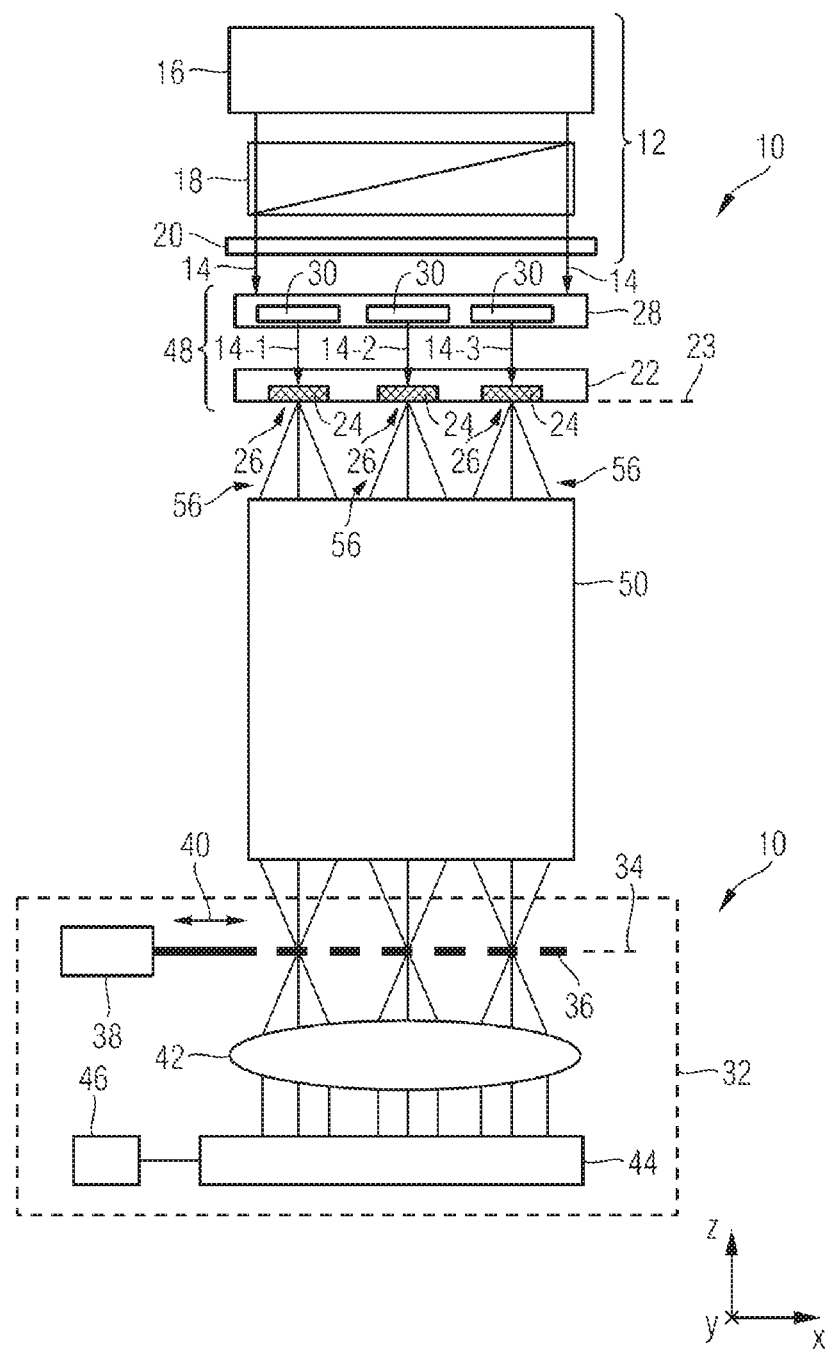
FIG. 1 shows one embodiment of a measurement system according to the invention for determining a polarization parameter of an optical system comprising a measurement mask and a polarization variation device.

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the invention.

In order to facilitate the description, a Cartesian xyz-coordinate system is indicated in the drawing, from which system the respective positional relationship of the components illustrated in the figures is evident. In FIG. 1, the y-direction runs perpendicular to and into the drawing plane, the x-direction toward the right, and the z-direction upwardly.

FIG. 1 shows one embodiment of a measurement system 10 according to the invention for determining a polarization parameter of an optical system 50 in the form of a projection lens of a projection exposure apparatus for microlithography. The optical system 50 can be designed for example for an operating wavelength in the UV wavelength range, such as 248 nm or 193 nm, for instance, or else for an operating wavelength in the EUV wavelength range, such as 13.5 nm or 6.8 nm, for instance. In the case of an EUV operating wavelength, the optical system 50 only comprises reflective optical elements in the form of mirrors.

In the embodiment shown, the measurement system 10 is configured as a shearing interferometer and to that end comprises an illumination system 12, a polarization variation device 28, a measurement mask 22 and a detection module 32. The measurement system 10 can be configured as a measurement arrangement independent of the optical system 50. Alternatively, the measurement system 10 can also be integrated into a projection exposure apparatus for microlithography which comprises the optical system 50 in the form of a projection lens. In this case, the illumination system 12 and the detection module 32 are preferably part of the projection exposure apparatus. The polarization variation device 28 and the measurement mask 22 can be integrated in a measurement reticle 48, which is loaded into the mask plane of the projection exposure apparatus in order to carry out the measurement process.

The measurement system 10 is described below as a measurement arrangement independent of the optical system 50. The illumination system 12 radiates optical radiation 14 with the operating wavelength of the optical system 50 in a defined polarization state onto the polarization variation device 28. For this purpose, the illumination system 12 comprises a radiation source 16 in the form of a laser, a polarizer 18 and a polarization rotating device 20. The radiation source 16 generates the optical radiation 14 with an already high degree of polarization. The polarized portion of the optical radiation 14 generated by the radiation source 16 is separated by the polarizer 18. This polarized portion can be rotated by the polarization rotating device 20. The polarization rotating device 20 can comprise a rotatable half-wave plate or a magazine occupied by rotators that can be brought successively into the beam path of the optical radiation 14.

In accordance with an embodiment, the polarization variation device 28 is fixed to the top side of the measurement mask 22 in a stationary manner, such that the polarization device 28 and the measurement mask 22 form a continuous measurement reticle 48. Alternatively, the polarization variation device 28 can also be embodied as a separate element and be arranged at a suitable position in the beam path of the optical radiation 14 incident on the measurement mask.

In the embodiment described here, the measurement system 10 serves for determining the field-resolved retardation of the optical system 12. Alternatively, however, the polarization parameter to be determined can also concern linear dichroism, rotation, circular dichroism or else the polarization dependence of a distortion aberration or of a focal position aberration of the optical system 12.

For the abovementioned determination of the field-resolved retardation, the polarizer 18 and the polarization rotating device 20 are set such that the optical radiation 14 incident on the polarization device 28 is present in a linear polarization state with a predefined polarization direction. In the following exemplary description, a state linearly polarized in the x-direction, said state being described by the Jones vector $$\begin{pmatrix} 1 \\ 0 \end{pmatrix},$$

is chosen for the optical radiation 14 incident on the polarization variation device 28.

The polarization variation device 28 comprises a multiplicity of polarization manipulation elements 30 in the form of differently oriented half-wave plates. Alternatively, as polarization manipulation elements 30 it is also possible to use modules comprising optically active substances for rotating the polarization direction or, for the case in which rotation or circular dichroism is intended to be determined as the polarization parameter, for example quarter-wave plates as well. The incident optical radiation 14 has different polarization states after passing through the polarization elements 30, such that different field points 26 of the measurement mask 22 are irradiated with optical radiation 14-1, 14-2, 14-3 having different polarization states, as illustrated in FIG. 1.

The measurement mask 22 is arranged below the polarization variation device 28 in an object plane 23 of the optical system 50. Measurement structures 24 are arranged at the abovementioned field points 26 of the measurement mask 22. The measurement structures 24 each have a grating structure and can be configured e.g. as a checkered grating or as a line grating. Such a measurement mask 22 is also known, in principle, by the term "coherence mask". FIG. 2 illustrates a first embodiment of such a measurement mask 22 together with a polarization variation device 28 adapted thereto.

The measurement mask in accordance with FIG. 2 has a uniform x/y-grid at measurement structures 24 distributed over the entire field of the measurement mask 22. For the purposes of the explanation below, the measurement structures 24 are classified in measurement fields 52. These measurement fields 52 are not necessarily identified physically on the measurement mask. In each case four measurement structures 24, to be precise in a matrix comprising two rows and two columns, are arranged in said measurement fields 52.

The polarization variation device 28 arranged above the measurement mask 22 in the beam path comprises a grid of polarization manipulation elements 30 adapted to the grid of the measurement mask 22. Said polarization manipulation elements are present here in four different variants, namely as half-wave plates 30A, 30B, 30C and 30D. In the case of the half-wave plate 30A, as illustrated in the legend of FIG. 2, the fast axis 31 thereof is oriented parallel to the incident radiation 14 linearly polarized in the x-direction, i.e. the rotation angle $\ominus$ is 0°. For the half-wave plate 30B it holds true that: $\ominus$=22.5°, for the half-wave plate 30C: $\ominus$=45° and for the half-wave plate 30D: $\ominus$=67.5°.

The polarization state of the optical radiation 14 is still unchanged after passing through one of the half-wave plates 30A (Jones vector:

$$\begin{pmatrix} 1 \\ 0 \end{pmatrix},$$

referred to as polarization state A below), and rotated by 45° after passing through one of the half-wave plates 30B (Jones vector:

$$\frac{1}{\sqrt{2}} \begin{pmatrix} 1 \\ 1 \end{pmatrix},$$

referred to as polarization state B below), rotated by 90° after passing through one of the half-wave plates 30C (Jones vector:

$$\begin{pmatrix} 0 \\ 1 \end{pmatrix},$$

referred to as polarization state C below), and rotated by 135° after passing through one of the half-wave plates 30D (Jones vector:

$$\frac{1}{\sqrt{2}} \begin{pmatrix} 1 \\ -1 \end{pmatrix},$$

referred to as polarization state D below).

Each of the measurement structures 24 defines a dedicated measurement channel 56 through the optical system 50, as illustrated in FIG. 1. The term measurement channels denotes the respective optical beam paths through the optical system 50. Since the optical radiation 14 emerging from a respective measurement structure 24 passes through the optical system 50 on respectively a dedicated optical beam path, field-point-dependent variations of optical aberrations of the optical system 50 can be determined by field-point-dependent evaluation of the optical radiation 14 after passing through the optical system 50.

In the embodiment in accordance with FIG. 2, the measurement channels 56 are respectively combined in groups of four in accordance with the classification of the measurement structures 24 into the measurement fields 52, wherein the measurement channels 56 of each group of four are operated in respectively different polarization states, to be precise in the polarization states A, B, C and D referred to above.

A wavefront deviation generated by the optical system 50 is determined for each of the measurement channels 56 by the detection module 32, as explained in greater detail below. By evaluating the measurement results of the respective measurement channels 56 combined to form a measurement field 52, it is possible to calculate the polarization parameter of the retardation for the location of the measurement field 52. Said location is referred to as measurement point 54 and is illustrated in FIG. 2 in the graphical illustration of the polarization variation device 28 for each of the measurement fields 52. The respective measurement point 54 lies in the respective center of the measurement fields 52 comprising a group of four measurement structures 24 and thus respectively in the center of a group of four measurement channels 56 operated with the polarization states A, B, C and D.

Furthermore, however, it is also possible to define further measurement fields (not depicted in FIG. 2) which respectively comprise a group of four measurement channels having the polarization states A, B, C and D, said group of four comprising two rows and two columns. Further measurement points 54, depicted in FIG. 2, are defined in the respective center of these further measurement fields. The retardation at the location of these further measurement points 54 is correspondingly determined by the evaluation of the wavefront measurement results at the locations of the measurement channels 56 surrounding them and having the polarization states A, B, C and D. As a result, it is thus possible to determine the retardation with a field resolution which corresponds to the density of the measurement structures 24 or the density of the measurement channels 56.

For the above-described field-resolved measurement of retardation, the detection module 32, as illustrated in FIG. 1, comprises a diffraction grating 36, which is arranged in the image plane 34 assigned to the object plane 23, and a displacement device 38. The diffraction grating 36 is displaced by the displacement device 38 during the measurement process in at least one movement direction 40, optionally also in two mutually orthogonal movement directions. This displacement is also called "phase shifting" and is effected in n steps. The waves generated at the diffraction grating 36 are imaged onto a two-dimensionally spatially resolving detector 44, optionally by a condenser optical unit 42. The interferograms generated on the detector surface in the individual steps are recorded by the detector 44. The derivatives of the wavefront are calculated by an evaluation unit 46. By integrating the derivatives, the wavefront of the optical radiation 14 after passing through the optical system 50 is thereupon calculated for each of the field points 26.

For each measurement field 52 four wavefronts $\Phi$ are then present, specifically $\Phi(0°)$ for the measurement channel 56 having the polarization state A (rotated by 0° relative to the input polarization), $\Phi(45°)$ for the measurement channel 56 having the polarization state B (rotated by 45° relative to the input polarization), $\Phi(90°)$ for the measurement channel 56 having the polarization state C (rotated by 90° relative to the input polarization) and $\Phi(135°)$ for the measurement channel 56 having the polarization state D (rotated by 135° relative to the input polarization).

For each of the wavefronts $\Phi(0°)$, $\Phi(45°)$, $\Phi(90°)$ and $\Phi(135°)$, the evaluation unit 46 then carries out a Zernike polynomial decomposition. Such a Zernike polynomial decomposition is known to the person skilled in the art for example from Chapter 13.2.3 of the textbook "Optical Shop Testing", 2nd Edition (1992) by Daniel Malacara, published by John Wiley & Sons, Inc. The Zernike polynomials obtained from the Zernike polynomial decomposition in accordance with so-called "Fringe" sorting are designated below. The "Fringe" sorting of the Zernike polynomials $Z_j$ is illustrated for example in table 20-2 on page 215 of the "Handbook of Optical Systems", Vol. 2 by H. Gross, 2005 Wiley-VCH Verlag GmbH & Co. KGaA, Weinheim. A wavefront $W(\rho,\varphi)$ at a point in the object plane 23 is then developed as follows:

$$W(\rho, \varphi) = \sum_j c_j \cdot Z_j(\rho, \varphi)$$

While the Zernike polynomials, also designated as Zernike functions, are designated by $Z_j$, i.e. with a subscripted index j, the Zernike coefficients $c_j$ hereinafter, as common among those skilled in the art, are also denoted by Zj, i.e. with a normally positioned index j. In this regard, for example, the Zernike coefficients which denote the geometrical distortion in the x- and y-directions respectively are designated as Z2 and Z3. The geometrical distortion $\vec{VZ}$ can be determined as follows from Z2, Z3 and the numerical aperture NA of the optical system 50, wherein $\vec{VZ}$, Z2 and Z3 are functions of the field point coordinates:

$$\vec{VZ} = -\frac{1}{NA} \cdot \begin{bmatrix} Z2 \\ Z3 \end{bmatrix}.$$

Hereinafter, the Zernike coefficients obtained for the individual rotation states $\varphi$ of the input polarization are designated by $Zj_\varphi$ such as e.g. $Z2_{0°}$ for the Zernike coefficient Z2 of the wavefront $\Phi(0°)$ measured for the measurement channel 56 having the polarization state A (0° polarization rotation).

In accordance with the publication "Orientation Zernike Polynomials: A useful way to describe the polarization effects of optical imaging systems" by J. Ruoff, M. Totzeck in Journal of Microlithography, Microfabrication, and Microsystems, July 2009, vol. 8, no. 3, 031404 (22 pp), it is possible to represent the orientation Zernike polynomials $OZ_j$ as Jones matrixes. The entries thereof correspond to polarized wavefront deviations, described by Zernike polynomials $Z_j$). By measuring the associated Zernike coefficients Zj, it is possible to determine the orientation Zernike coefficients OZj as matrixes. The total retardation can be represented as a series by way of the orientation Zernike polynomials $OZ_j$. The coefficients OZj of these series are determined by way of the Zernike coefficients $Zj_\varphi$, measured in a polarized manner, as described below on the basis of low-order orientation Zernike coefficients, specifically on the basis of the orientation Zernike coefficients OZ2, OZ-2, OZ3 and OZ-3.

It holds true that:

$OZ2+OZ-2=Z2_{0°}-Z2_{90°}=\Delta Z2_{0°,90°}$ $OZ2-OZ-2=Z3_{45°}-Z3_{135°}=\Delta Z3_{45°,135°}$ $OZ3+OZ-3=Z3_{0°}-Z3_{90°}=\Delta Z3_{0°,90°}$ $OZ3-OZ3=Z2_{45°}+Z2_{135°}=-\Delta Z2_{45°,135°}$ It follows therefrom for the orientation Zernike coefficients OZ2, OZ-2, OZ3 and OZ-3 that:

$OZ2=\frac{1}{2}\cdot(\Delta Z2_{0°,90°}+\Delta Z3_{45°,135°})$ $OZ-2=\frac{1}{2}\cdot(\Delta Z2_{0°,90°}-\Delta Z3_{45°,135°})$ $OZ3=\frac{1}{2}\cdot(\Delta Z3_{0°,90°}-\Delta Z2_{45°,135°})$ $OZ-3=\frac{1}{2}\cdot(\Delta Z3_{0°,90°}+\Delta Z2_{45°,135°})$ Higher-order orientation Zernike coefficients are also calculated analogously. The retardation at the relevant measurement point 54 is determined from the orientation Zernike coefficients $OZ\pm2/\pm3/\pm4$ calculated in this way. An analogous procedure is adopted with regard to all the further measurement points illustrated in FIG. 2. In principle, the polarization properties of the optical system 50 may be subjected to fluctuations as a result of temporally variable environmental conditions. With the simultaneous measurement of the wavefronts for the different polarization states, it is possible to exclude influences of such fluctuations in the polarization properties of the optical system 50 on the orientation Zernike coefficients.

In order to calibrate the measurement system, the optical radiation 14 incident on the polarization variation device 28 is provided in further polarization states and the above-described wavefront measurement on the optical system 50 is carried out for each of said polarization states. In this regard, for example, the incident optical radiation 14, in addition to the polarization state $$\begin{pmatrix} 1 \\ 0 \end{pmatrix}$$

chosen above, can also be provided successively with the following input polarization states:

$$\frac{1}{\sqrt{2}}\begin{pmatrix} 1 \\ 1 \end{pmatrix}, \begin{pmatrix} 0 \\ 1 \end{pmatrix}, \frac{1}{\sqrt{2}}\begin{pmatrix} 1 \\ -1 \end{pmatrix}.$$

After passing through the half-wave plates 30A, 30B, 30C and 30D of the polarization variation device 28, the rotation angles or Jones vectors presented in tab. 1 thereupon result for the individual output polarization states A, B, C, D. As is evident from the table, each of the four linear polarization states $$\begin{pmatrix} 1 \\ 0 \end{pmatrix}, \frac{1}{\sqrt{2}}\begin{pmatrix} 1 \\ 1 \end{pmatrix}, \begin{pmatrix} 0 \\ 1 \end{pmatrix} \text{ and } \frac{1}{\sqrt{2}}\begin{pmatrix} 1 \\ -1 \end{pmatrix}$$

i.e. the linear polarization states of the orientation directions 0°, 45°, 90° and 135°, is applied to each of the four measurement channels 56 of a measurement field 52 that are defined by the half-wave plates 30A, 30B, 30C and 30D.

By comparing the measurement results for the retardation upon incidence of the four different input polarization states, it is possible to check whether the measurement system 10 is polarization-independent. If it is the case, the retardation measured with regard to the individual measurement points 54 should be independent of the input polarization state. In the case in which deviations in the retardation are measured with the use of different input polarization states, these deviations can be used for calibrating the measurement system 10 and can be correspondingly taken into account in the evaluation of future measurements by the evaluation unit 46.

TABLE 1

| | | Input polarization states | | | |
|---|---|---|---|---|---|
| | | $0°, \begin{pmatrix} 1 \\ 0 \end{pmatrix}$ | $45°, \frac{1}{\sqrt{2}}\begin{pmatrix} 1 \\ 1 \end{pmatrix}$ | $90°, \begin{pmatrix} 0 \\ 1 \end{pmatrix}$ | $135°, \frac{1}{\sqrt{2}}\begin{pmatrix} 1 \\ -1 \end{pmatrix}$ |
| Rotation at half-wave plates | 0° (A) | $0°, \begin{pmatrix} 1 \\ 0 \end{pmatrix}$ | $45°, \frac{1}{\sqrt{2}}\begin{pmatrix} 1 \\ 1 \end{pmatrix}$ | $90°, \begin{pmatrix} 0 \\ 1 \end{pmatrix}$ | $135°, \frac{1}{\sqrt{2}}\begin{pmatrix} 1 \\ -1 \end{pmatrix}$ |
| | 45° (B) | $45°, \frac{1}{\sqrt{2}}\begin{pmatrix} 1 \\ 1 \end{pmatrix}$ | $90°, \begin{pmatrix} 0 \\ 1 \end{pmatrix}$ | $135°, \frac{1}{\sqrt{2}}\begin{pmatrix} 1 \\ -1 \end{pmatrix}$ | $0°, \begin{pmatrix} 1 \\ 0 \end{pmatrix}$ |
| | 90° (C) | $90°, \begin{pmatrix} 0 \\ 1 \end{pmatrix}$ | $135°, \frac{1}{\sqrt{2}}\begin{pmatrix} 1 \\ -1 \end{pmatrix}$ | $0°, \begin{pmatrix} 1 \\ 0 \end{pmatrix}$ | $45°, \frac{1}{\sqrt{2}}\begin{pmatrix} 1 \\ 1 \end{pmatrix}$ |
| | 135° (D) | $135°, \frac{1}{\sqrt{2}}\begin{pmatrix} 1 \\ -1 \end{pmatrix}$ | $0°, \begin{pmatrix} 1 \\ 0 \end{pmatrix}$ | $45°, \frac{1}{\sqrt{2}}\begin{pmatrix} 1 \\ 1 \end{pmatrix}$ | $90°, \begin{pmatrix} 0 \\ 1 \end{pmatrix}$ |

FIG. 3 shows a further embodiment of a measurement mask 22 and a polarization variation device 28 adapted thereto. This differs from the embodiment in accordance with FIG. 2 to the effect that the measurement structures 24, instead of being arranged in a uniform x/y grid, are arranged in a rhombic pattern in which the measurement structures 24 are respectively arranged along oblique lines. The polarization elements 30 on the polarization variation device 28 are arranged analogously to the pattern of the measurement structures 24. In this arrangement, too, the measurement points 54 are situated in the respective center of a group of four measurement structures 24 irradiated with the polarization states A, B, C and D, as illustrated in FIG. 3.

In a further embodiment of the measurement system 10, as already mentioned above, a distortion aberration of the optical system is examined with regard to its polarization dependence in a field-point-dependent manner. This embodiment differs from the embodiment shown in FIG. 1 to the effect that the measurement structures 24 on the measurement mask 22 are embodied as crosses or similar structures rather than as a checkered pattern.

Furthermore, instead of the module shown in FIG. 1, merely a wafer coated with photoresist is used as the detection module 32. During the measurement process, the measurement structures 24 described above are imaged onto the wafer. Afterward, the exposed wafer is examined with regard to distortion aberrations by overlay measurement under a suitable microscope, such as an electron microscope, for instance. As a result of this examination, the polarization dependence of a distortion aberration of the optical system 50 is determined at the individual field points. The polarization dependence of focal position aberrations can also be determined analogously.

The present description of exemplary embodiments is to be understood to be by way of example. The disclosure effected thereby firstly enables the person skilled in the art to understand the present invention and the advantages associated therewith, and secondly encompasses alterations and modifications of the described structures and methods that are also obvious in the understanding of the person skilled in the art. Therefore, all such alterations and modifications, insofar as they fall within the scope of the invention in accordance with the definition in the accompanying claims, and equivalents are intended to be covered by the protection of the claims.

LIST OF REFERENCE SIGNS

10 Measurement system
12 Illumination system
14 Optical radiation
16 Radiation source
18 Polarizer
20 Polarization rotating device
22 Measurement mask
23 Object plane
24 Measurement structure
26 Field point
28 Polarization variation device
30 Polarization manipulation element
30A, 30B, 30C, 30D Half-wave plates
31 Fast axis
32 Detection module
34 Image plane
36 Diffraction grating
38 Displacement device
40 Movement direction
42 Condenser optical unit
44 Detector
46 Evaluation unit
48 Measurement reticle
50 Optical system
52 Measurement field
54 Measurement point
56 Measurement channel

What is claimed is:

1. A measurement system for determining a polarization parameter of an optical system, comprising:
an illumination system configured to provide an optical radiation,
a measurement mask arranged between the illumination system and the optical system and comprising measurement structures arranged at a plurality of field points of the measurement mask,
a polarization variation device arranged in a beam path of the optical radiation and configured to vary a polarization state of the optical radiation in a field-point-dependent manner, such that at a single point in time one of the field points is irradiated with the optical radiation in a first polarization state and another of the field points is irradiated with the optical radiation in a second polarization state that differs from the first polarization state, and
a detection module configured to detect the optical radiation after the optical radiation has interacted with the optical system.

2. The measurement system as claimed in claim 1, wherein the polarization variation device comprises at least one polarization rotation element configured to rotate the incident optical radiation.

3. The measurement system as claimed in claim 1, wherein the polarization variation device comprises at least one half-wave plate.

4. The measurement system as claimed in claim 1, wherein the polarization variation device comprises at least one quarter-wave plate.

5. The measurement system as claimed in claim 1, wherein the measurement structures are arranged in a plurality of measurement fields and the polarization variation device is configured to vary the polarization state of the optical radiation within each of the measurement fields with a single variation pattern in a field-point-dependent manner.

6. The measurement system as claimed in claim 1, wherein the polarization variation device is fixed to the measurement mask.

7. The measurement system as claimed in claim 1, which is configured as a wavefront measurement system.

8. The measurement system as claimed in claim 1, wherein the detection module comprises a diffraction grating.

9. The measurement system as claimed in claim 1, wherein the illumination system is configured to provide the optical radiation successively in different polarization states.

10. The measurement system as claimed in claim 1, wherein the illumination system is configured to provide the optical radiation in a linearly polarized state.

11. A projection exposure apparatus for microlithography comprising a projection lens as the optical system and a measurement system as claimed in claim 1,
wherein the measurement system is configured to determine a polarization parameter of the projection lens.

12. A method for determining a polarization parameter of an optical system, comprising:
providing a measurement mask comprising measurement structures arranged at a plurality of field points of the measurement mask,
radiating optical radiation onto the measurement mask with a field-point-dependent polarization pattern such that at a single point in time one of the field points is irradiated with the optical radiation in a first polarization state and another of the field points is irradiated with the optical radiation in a second polarization state that differs from the first polarization state,
detecting the optical radiation after the optical radiation has interacted with the measurement mask and has subsequently interacted with the optical system, and
determining the polarization parameter of the optical system from the detected optical radiation.

13. The method as claimed in claim 12,
wherein said determining of the polarization parameter of the optical system comprises determining orientation Zernike coefficients of the optical system from the detected optical radiation.

* * * * *

UNITED STATES PATENT AND TRADEMARK OFFICE
CERTIFICATE OF CORRECTION

PATENT NO. : 10,042,264 B2
APPLICATION NO. : 15/275686
DATED : August 7, 2018
INVENTOR(S) : Andreas Wirsing Page 1 of 1

It is certified that error appears in the above-identified patent and that said Letters Patent is hereby corrected as shown below:

In the Specification

In Column 7, Line 65, delete "ϴ" and insert -- Θ -- therefor.

In Column 7, Line 66, delete both instances of "ϴ" and insert, in both instances, -- Θ -- therefor.

In Column 7, Line 67, delete "ϴ" and insert -- Θ -- therefor.

In Column 10, Line 50, delete "OZ3-OZ3" and insert -- OZ3-OZ-3 -- therefor.

In Column 11, Lines 36-40, delete "$\begin{pmatrix} 1 \\ 0 \end{pmatrix}$" and insert -- $\begin{pmatrix} 1 \\ 0 \end{pmatrix}$ -- therefor.

Signed and Sealed this
Eighth Day of December, 2020

Andrei Iancu
*Director of the United States Patent and Trademark Office*